(12) United States Patent
van Setten et al.

(10) Patent No.: US 12,349,430 B2
(45) Date of Patent: Jul. 1, 2025

(54) MIXED METAL OXIDE

(71) Applicant: IMEC vzw, Leuven (BE)

(72) Inventors: Michiel Jan van Setten, Heverlee (BE); Hendrik F. W Dekkers, Tienen (BE); Karl Opsomer, Huise—Zingem (BE); Geoffrey Pourtois, Leuven (BE); Gouri Sankar Kar, Leuven (BE)

(73) Assignee: IMEC vzw, Leuven (BE)

( * ) Notice: Subject to any disclaimer, the term of this patent is extended or adjusted under 35 U.S.C. 154(b) by 520 days.

(21) Appl. No.: 17/810,548

(22) Filed: Jul. 1, 2022

(65) Prior Publication Data
US 2023/0010899 A1 Jan. 12, 2023

(30) Foreign Application Priority Data

Jul. 3, 2021 (EP) .................................... 21183584

(51) Int. Cl.
*H01L 29/24* (2006.01)
*C01G 9/00* (2006.01)
(Continued)

(52) U.S. Cl.
CPC ............. *H10D 62/80* (2025.01); *C01G 9/006* (2013.01); *C01G 15/006* (2013.01);
(Continued)

(58) Field of Classification Search
CPC ...... H10D 62/80; H10D 62/402; H10D 62/40; H10D 30/6755; H10D 30/67;
(Continued)

(56) References Cited

U.S. PATENT DOCUMENTS 7,410,917 B2 * 8/2008 Ahn .................. H01L 21/28194
427/124
8,613,798 B2 * 12/2013 Lee .................. H01L 21/02197
106/286.6
(Continued)

FOREIGN PATENT DOCUMENTS

CN 102851791 A 1/2013
CN 111635223 A 9/2020

OTHER PUBLICATIONS

El Hamidi et al., "Effect of Mg Doping on Structural and Optical Properties of Al—Mg—Co-doped ZnO Thin Films Deposited via Sol-Gel Technique", Research and Reviews: Journal of Material Sciences, 2018, 6:2, pp. 99-109.
(Continued)

*Primary Examiner* — Yara B Green
(74) *Attorney, Agent, or Firm* — Knobbe, Martens, Olson & Bear, LLP

(57) ABSTRACT

In an aspect, a mixed metal oxide comprises or consists essentially of: a mixture comprises or consisting essentially of 0.30 to 0.69 parts by mole Mg, 0.20 to 0.69 parts by mole Zn, 0.01 to 0.30 parts by mole of a third element selected from Al and Ga, and, either, when the third element is Al, 0.00 to 0.31 parts by mole of other elements selected from metals and metalloids, or, when the third element is Ga, 0.00 to 0.15 parts by mole of other elements selected from metals and metalloids, wherein the sum of all parts by mole of Mg, Zn, the third element, and the other elements amounts to 1.00, wherein the amount in parts by mole of the other elements is lower than the amount in parts by mole of Mg and is lower than the amount in parts by mole of Zn; oxygen; and less than 0.01 parts by mole of non-metallic and non-metalloid impurities.

20 Claims, 9 Drawing Sheets

(51) Int. Cl.
  *C01G 15/00* (2006.01)
  *H01L 21/02* (2006.01)
  *H10D 30/67* (2025.01)
  *H10D 62/40* (2025.01)
  *H10D 62/80* (2025.01)

(52) U.S. Cl.
  CPC .. *H01L 21/02565* (2013.01); *H01L 21/02592* (2013.01); *H01L 21/02631* (2013.01); *H10D 30/6755* (2025.01); *H10D 62/402* (2025.01); *C01P 2002/02* (2013.01); *C01P 2002/50* (2013.01); *C01P 2006/40* (2013.01)

(58) Field of Classification Search
  CPC ........... H10D 30/6739; H10D 30/6769; C01G 9/006; C01G 9/00; C01G 9/02; C01G 15/006; C01G 15/00; H01L 21/02565; H01L 21/02592; H01L 21/02631; H01L 21/02; H01L 21/02274; H01L 21/0217; C01P 2002/02; C01P 2002/50; C01P 2002/52; C01P 2002/54; C01P 2006/80; C01P 2006/40; C23C 14/08; C23C 14/3464; C23C 14/34
  See application file for complete search history.

(56) References Cited

U.S. PATENT DOCUMENTS

| | | | |
|---|---|---|---|
| 8,679,246 B2 | 3/2014 | Jordan et al. | |
| 8,907,336 B2 | 12/2014 | Shieh et al. | |
| 9,105,527 B2 | 8/2015 | Van Duren et al. | |
| 9,178,022 B2* | 11/2015 | Shimoda | C01G 55/00 |
| 10,236,349 B2 | 3/2019 | Abe et al. | |
| 11,201,214 B2* | 12/2021 | Tak | H10D 30/6757 |
| 2007/0269683 A1* | 11/2007 | Chen | C04B 35/486 |
| | | | 106/286.2 |
| 2013/0112973 A1* | 5/2013 | Shimoda | H10D 30/6739 |
| | | | 252/521.1 |
| 2013/0213263 A1* | 8/2013 | Lee | H01L 21/02266 |
| | | | 106/286.2 |
| 2014/0326319 A1 | 11/2014 | Kim et al. | |
| 2015/0108472 A1* | 4/2015 | Suzawa | H10D 30/6729 |
| | | | 257/43 |
| 2015/0325707 A1 | 11/2015 | Sano et al. | |
| 2017/0012138 A1 | 1/2017 | Suzawa et al. | |
| 2017/0256676 A1 | 9/2017 | Asadi et al. | |
| 2022/0037561 A1 | 2/2022 | Ueoka et al. | |

OTHER PUBLICATIONS

Hussain et al., "Structural and dielectric properties of Zn-doped $MgAl_2O_4$,", The 2014 World Congress on Advances in Civil, Environmental and Materials Research (ACEM14), Aug. 2014.

Li et al., "Bi-Layer Channel AZO/ZnO Thin Film Transistors Fabricated by Atomic Layer Deposition Technique", Nanoscale Research Letters, 2017, 12:223, pp. 1-6.

Yang et al, "Tailoring Bandgap and Electrical Properties of Magnesium-Doped Aluminum Zinc Oxide Films Deposited by Reactive Sputtering Using Metallic Mg and Al—Zn Targets" Coatings, 2020, 10: 708, pp. 1-12.

A. de Jamblinne de Meux et al, "Method to Quantify the Delocalization of Electronic States in Amorphous Semiconductors and its Application to Assessing Charge Carrier Mobility of P-type Amorphous Oxide Semiconductors", Physical Review B 97 (2018) 045208.

European Search Report dated Dec. 8, 2022 in European Application No. 22176414.5.

* cited by examiner

MIXED METAL OXIDE

CROSS-REFERENCE TO RELATED APPLICATIONS

This application claims foreign priority to European Patent Application No. 21183584.8, filed Jul. 3, 2021, the content of which is incorporated by reference herein in its entirety.

BACKGROUND

Field

The present disclosure relates to the field of mixed metal oxides, and more in particular to mixed metal oxides for use as a channel in thin-film transistors (TFT).

Description of the Related Technology

Thin film transistors are widely used in displays, memory, and logic devices. Due to their possibly intensive long-term use, TFTs preferably comprise chemically stable materials. Furthermore, and more in particular, the material for the channel of a TFT preferably enables high on-currents and low off-currents, that is, a high current in the on-state and a low current in the off-state.

The process for forming TFTs is typically in the back-end-of-line (BEOL) stage of integrated circuit fabrication. Furthermore, in the particular application of 3D memory devices, memory cells comprising transistors, e.g., thin film transistors, are typically stacked so as to form the 3D memory device. In the process of forming a new memory cell above an existing one, it is preferably to avoid temperatures above 400° C. so as not to damage any already formed memory cells. However, such a limitation on deposition temperatures severely limit the type of materials that may be deposited for fabricating TFTs. Many materials typically used as a channel material crystallize at higher crystallization temperatures, which them unfavorable for use in TFTs.

On the contrary, the deposition of amorphous materials may be performed at temperatures lower than these high thermal treatments. However, the resulting films tend to be associated with significantly lower charge carrier mobilities than their crystalline counterparts. Moreover, to be compatible with silicon technology, the materials are preferably chemically stable against forming gas anneal. Amorphous materials are intrinsically less stable than their crystalline counterparts.

The current best amorphous oxide, the metal oxide amorphous $InGaZnO_4$ (a-$InGaZnO_4$), also referred to as IGZO, has, compared to typical amorphous oxides, relatively high electron mobility. The relatively high electron mobility is due to the interaction of s and d orbitals of the metal cations in a lower part of the conduction band. The strength of the bonds between the cations, and, in addition, the type of cations, drive the effective mobility of the system. The mobility of IGZO and its chemical stability are, however, not sufficiently high. IGZO has a rather low electron mobility (approximately 20 to 35 $cm^2/(Vs)$) and low chemical stability.

There is therefore a need in the art for a material and method for forming the material that solves one or more of the above problems.

SUMMARY OF CERTAIN INVENTIVE ASPECTS

It is an object of the present disclosure to provide a good mixed metal oxide. It is a further object of the present disclosure to provide a good method for forming the mixed metal oxide, and a transistor comprising the mixed metal oxide.

The above objective is accomplished by a method and apparatus according to the present disclosure.

It is an advantage of embodiments of the present disclosure that the mixed metal oxide may have a good electron mobility. It is an advantage of embodiments of the present disclosure that a channel in a transistor comprising the mixed metal oxide, may exhibit high current in the on-state, and low current in the off-state.

It is an advantage of embodiments of the present disclosure that the chemical stability of the mixed metal oxide may be good. It is an advantage of embodiments of the present disclosure that the mixed metal oxide may have good stability against annealing in a forming gas atmosphere, which is a step that is often performed in semiconductor manufacturing processes.

It is an advantage of embodiments of the present disclosure that elements making up the mixed metal oxide may be non-toxic. It is an advantage of embodiments of the present disclosure that elements making up the mixed metal oxide may be compatible with standard industrial silicon technology.

It is an advantage of embodiments of the present disclosure that the mixed metal oxide may be deposited at temperatures below 400° C. It is an advantage of embodiments of the present disclosure that the mixed metal oxide may be deposited in the back-end-of-line (BEOL) stage of semiconductor manufacturing processing. For example, silicon devices, e.g., silicon logics, may degrade at temperatures above 400° C.

It is an advantage of embodiments of the present disclosure that the mixed metal oxide may have good properties for use of the mixed metal oxide in transistors, such as in thin-film transistors (TFT), for example as channel material.

In a first aspect, the present disclosure relates to a mixed metal oxide comprising or consisting essentially of: a) a mixture comprising or consisting essentially of 0.30 to 0.69 parts by mole Mg, 0.20 to 0.69 parts by mole Zn, 0.01 to 0.30 parts by mole of a third element selected from Al and Ga, and, either, when the third element is Al, 0.00 to 0.31 parts by mole of other elements other than Mg, Zn, and Al, selected from metals and metalloids, or when the third element is Ga, 0.00 to 0.15 parts by mole of other elements other than Mg, Zn, and Ga, selected from metals and metalloids, wherein the sum of all parts by mole of Mg, Zn, the third element selected from Al and Ga, and the other elements other than Mg, Zn, and the selected third element, selected from metals and metalloids amounts to 1.00, with the proviso that the amount in parts by mole of the other elements other than Mg, Zn, and the selected third element, selected from metals and metalloids is lower than the amount in parts by mole of Mg and is lower than the amount in parts by mole of Zn, b) oxygen, and c) less than 0.01 parts by mole of non-metallic and non-metalloid impurities, wherein the parts by mole are as measured by Rutherford Backscattering Spectroscopy.

In a second aspect, the present disclosure relates to a method for forming the oxide according to embodiments of the first aspect, comprising depositing on a substrate a magnesium oxide, a zinc oxide, and an oxide of a third element selected from Al and Ga, and optionally one or more other oxides other than magnesium oxide, zinc oxide, and the oxide of the third element selected from Al and Ga, selected from metal oxides and metalloid oxides, so as to form a mixed metal oxide comprising or consisting essentially of: a) a mixture comprising or consisting essentially of 0.30 to 0.69 parts by mole Mg, 0.20 to 0.69 parts by mole Zn, 0.01 to 0.30 parts by mole of the third element selected from Al and Ga, and either, when the third element is Al, 0.00 to 0.31 parts by mole of other elements other than Mg, Zn, and Al, selected from metals and metalloids, or when the third element is Ga, 0.00 to 0.15 parts by mole of other elements other than Mg, Zn, and Ga, selected from metals and metalloids, wherein the sum of all parts by mole of Mg, Zn, the third element selected from Al and Ga, and the other elements other than Mg, Zn, and the selected third element selected from metals and metalloids amounts to 1.00, with the proviso that the amount in parts by mole of the other elements other than Mg, Zn, and the selected third element selected from metals and metalloids is lower than the amount in parts by mole of Mg and is lower than the amount in parts by mole of Zn, b) oxygen, and c) less than 0.01 parts by mole of non-metallic and non-metalloid impurities, wherein the parts by mole are as measured by Rutherford Backscattering Spectroscopy.

In a third aspect, the present disclosure relates to a transistor comprising the oxide according to any embodiment of the first aspect.

In another aspect, a mixed metal oxide is disclosed. The mixed metal oxide comprises or consists essentially of: a mixture comprising or consisting essentially of 0.30 to 0.69 parts by mole Mg, 0.20 to 0.69 parts by mole Zn, 0.01 to 0.30 parts by mole of a third element selected from Al and Ga, and at least one other element selected from metals and metalloids other than Mg, Zn and the third element, wherein when the third element is Al, the at least one other element is present at greater than zero and up to 0.31 parts by mole, and wherein when the third element is Ga, the at least one other element is present at greater than zero and up to 0.15 parts by mole; oxygen; and less than 0.01 parts by mole of non-metallic and non-metalloid impurities. In some examples, a sum of all parts by mole of Mg, Zn, the third element, and the at least one other element amounts to 1.00. In some examples, the amount in parts by mole of the at least one other element is lower than the amount in parts by mole of each of Mg and Zn. In some examples, the third element is Al and the at least one other element is Ga. In some examples, the third element is Ga and the at least one other element is Al.

In some examples, the third element is Al and the mixture comprises or consists essentially of: 0.30 to 0.69 parts by mole Mg; 0.30 to 0.69 parts by mole Zn; 0.01 to 0.15 parts by mole Al; and 0.00 to 0.31 parts by mole of the at least one other element selected from metals and metalloids other than Mg, Zn and Al.

In some examples, the amount of Mg in parts by mole is within 0.05 of the amount of Zn in parts by mole. In some examples, the third element is Ga and the mixture comprises or consists essentially of: 0.40 to 0.60 parts by mole Mg; 0.20 to 0.40 parts by mole Zn; 0.10 to 0.30 parts by mole Ga; and 0.00 to 0.15 parts by mole of the at least one other element selected from metals and metalloids other than Mg, Zn and Ga.

In some examples, the third element is Ga and the mixture comprises or consists essentially of: 0.45 to 0.55 parts by mole Mg; 0.25 to 0.35 parts by mole Zn; 0.15 to 0.25 parts by mole Ga; and 0.00 to 0.15 parts by mole of the at least one other element selected from metals and metalloids other than Mg, Zn and Ga.

In some examples, the oxygen is present in an amount that is within 10 mole-% of a stoichiometric amount. In some examples, the mixed metal oxide is in an amorphous phase.

In another aspect, a method for forming a mixed metal oxide is disclosed. In some examples, the method comprises depositing a magnesium oxide, a zinc oxide, and an oxide of the third element selected from Al and Ga on a substrate. In some examples, the mixed metal oxide comprises or consists essentially of: a mixture comprising or consisting essentially of: 0.30 to 0.69 parts by mole Mg, 0.20 to 0.69 parts by mole Zn, 0.01 to 0.30 parts by mole of the third element selected from Al and Ga, and at least one other element selected from metals and metalloids other than Mg, Zn and the third element, wherein when the third element is Al, the at least one other element is present at greater than zero and up to 0.31 parts by mole, and wherein when the third element is Ga, the at least one other element is present at greater than zero and up to 0.15 parts by mole; oxygen; and less than 0.01 parts by mole of non-metallic and non-metalloid impurities. In some examples, a sum of all parts by mole of Mg, Zn, the third element, and the at least one other element amounts to 1.00. In some examples, amount in parts by mole of the at least one other element is lower than amount in parts by mole of Mg.

In some examples, the amount in parts by mole of the at least one other element is lower than amount in parts by mole of Zn. In some examples, the method further comprises depositing one or more other oxides of the at least one other element on the substrate. In some examples, the deposition is performed at a temperature lower than about 400° C. In some examples, the deposition is preferably at a temperature range of about 200 to about 400° C. In some examples, the magnesium oxide, the zinc oxide, and the oxide of the third element selected from Al and Ga are deposited using physical vapour deposition. In some examples, the physical vapour deposition is performed by sputtering using a magnesium oxide target, a zinc oxide target, and a target of the third element. In some examples, a first AC potential field is applied to the magnesium oxide target and to the zinc oxide target at a frequency of from 100 kHz to 10 MHz, and a DC potential field is applied to the target of the third element. In some examples, the substrate comprises silicon.

In another aspect, a transistor comprising a mixed metal oxide is disclosed. In some examples, the mixed metal oxide comprises or consists essentially of: a mixture comprising or consisting essentially of: 0.30 to 0.69 parts by mole Mg, 0.20 to 0.69 parts by mole Zn, 0.01 to 0.30 parts by mole of a third element selected from Al and Ga, and at least one other element selected from metals and metalloids other than Mg, Zn and the third element, wherein when the third element is Al, the at least one other element is present at greater than zero and up to 0.31 parts by mole, and wherein when the third element is Ga, the at least one other element is present at greater than zero and up to 0.15 parts by mole; oxygen; and less than 0.01 parts by mole of non-metallic and non-metalloid impurities. In some examples, a sum of all parts by mole of Mg, Zn, the third element, and the at least one other element amounts to 1.00. In some examples, the amount in parts by mole of the at least one other element is lower than the amount in parts by mole of Mg. In some examples, the amount in parts by mole of the at least one other element is lower than the amount in parts by mole of Zn.

In some examples, the mixed metal oxide forms a channel layer. In some examples, the transistor is a thin film transistor.

Particular and preferred aspects of the disclosure are set out in the accompanying independent and dependent claims. Features from the dependent claims may be combined with features of the independent claims and with features of other dependent claims as appropriate and not merely as explicitly set out in the claims.

Although there has been constant improvement, change, and evolution of devices in this field, the present concepts are believed to represent substantial new and novel improvements, including departures from prior practices, resulting in the provision of more efficient, stable, and reliable devices of this nature.

The above and other characteristics, features, and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

DETAILED DESCRIPTION OF CERTAIN ILLUSTRATIVE EMBODIMENTS

Figure 1:
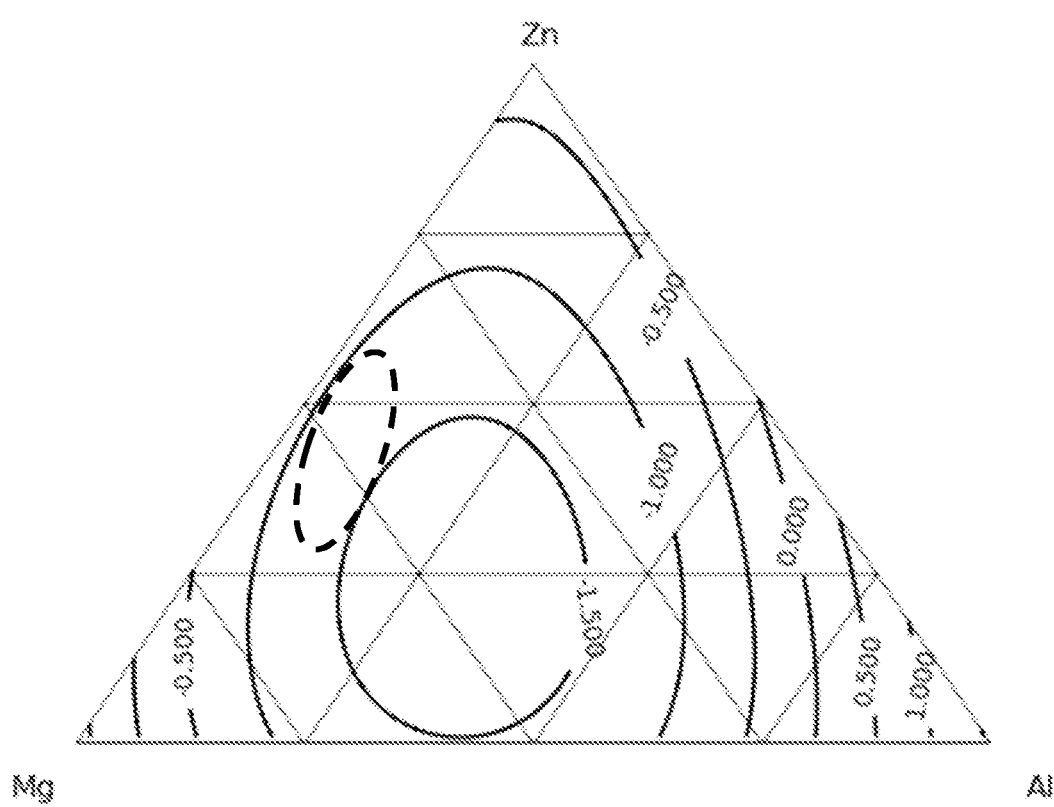
FIG. 1 is a triangular plot of the inverse state weighted overlap of the conduction band of a mixed metal oxide, as dependent on the amount of Zn, Mg, and Al in the mixed metal oxide.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second, third, and the like in the description and in the claims, are used for distinguishing between similar elements and not necessarily for describing a sequence, either temporally, spatially, in ranking, or in any other manner. It is to be understood that the terms so used are interchangeable under appropriate circumstances and that the embodiments of the disclosure described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps, or components, or groups thereof. The term "comprising" therefore covers the situation where only the stated features are present and the situation where these features and one or more other features are present. The word "comprising" according to the invention therefore also includes as one embodiment that no further components are present. Thus, the scope of the expression "a device comprising means A and B" should not be interpreted as being limited to devices consisting only of components A and B. It means that with respect to the present invention, the only relevant components of the device are A and B.

Reference throughout this specification to "one embodiment" or "an embodiment" means that a particular feature, structure, or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures, or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures, and techniques have not been shown in detail in order not to obscure an understanding of this description.

Reference will be made to transistors. These are devices having a first main electrode such as a drain, a second main electrode such as a source, a channel connecting the drain and the source, and a control electrode such as a gate for controlling the flow of electrical charges between the first and second main electrodes, through the channel.

In the context of the present disclosure, unless otherwise stated, when an amount, e.g., in parts by mole, of an element is mentioned, the amount is as measured by Rutherford Backscattering Spectroscopy.

In the context of the present disclosure, a metalloid is understood to be an element selected from arsenic, tellurium, germanium, silicon, antimony, and boron.

In a first aspect, the present disclosure relates to a mixed metal oxide comprising or consisting essentially of: a) a mixture comprising or consisting essentially of 0.30 to 0.69 parts by mole Mg, 0.20 to 0.69 parts by mole Zn, 0.01 to 0.30 parts by mole of a third element selected from Al and Ga, and, either, when the third element is Al, 0.00 to 0.31 parts by mole of other elements other than Mg, Zn, and Al, selected from metals and metalloids, or when the third element is Ga, 0.00 to 0.15 parts by mole of other elements other than Mg, Zn, and Ga, selected from metals and metalloids, wherein the sum of all parts by mole of Mg, Zn, the third element selected from Al and Ga, and the other elements other than Mg, Zn, and the selected third element selected from metals and metalloids amounts to 1.00, with the proviso that the amount in parts by mole of the other elements other than Mg, Zn, and the selected third element selected from metals and metalloids is lower than the amount in parts by mole of Mg and is lower than the amount in parts by mole of Zn, b) oxygen, and c) less than 0.01 parts by mole of non-metallic and non-metalloid impurities, wherein the parts by mole are as measured by Rutherford Backscattering Spectroscopy.

The inventors have found that, surprisingly, mixed metal oxides of the disclosure may have a combination of good electrical conductivity, and good stability, e.g., chemical stability. Without being bound by theory, the mixed metal oxide having amounts of Mg, Zn, and the third element selected from Al and Ga according to the present disclosure results in a conduction band that is strongly delocalized over cation sites within the mixed metal oxide, similar to a conduction band of a-InGaZnO$_4$. This results in good electrical conductivity. Furthermore, the mixed metal oxides of the present disclosure have a preferred bandgap that is similar to, or slightly larger than, the bandgap of a-InGaZnO$_4$. Thereby, when, for example, the mixed metal oxide is used as a channel in a transistor, a current through the channel in an off-state of the transistor may be small. The third element selected from Al and Ga provides good stability to the mixed metal oxide. At the same time, increasing the amount of the third element selected from Al and Ga in the mixed metal oxide may further increase the bandgap. An increase in bandgap may result in a reduction in dopability. Therefore, preferably, the third element selected from Al and Ga is present in an amount not larger than what is suitable to induce stability to the mixed metal oxide. Similar to doping an a-InGaZnO$_4$, doping of the mixed metal oxide may be induced by an oxygen deficit, compared to a stoichiometric amount of oxygen, in the mixed metal oxide.

In some embodiments, the third element is Al, and the mixture comprises or consists essentially of 0.30 to 0.69 parts by mole Mg, 0.30 to 0.69 parts by mole Zn, 0.01 to 0.15 parts by mole Al, and 0.00 to 0.31 parts by mole of other elements other than Mg, Zn, and Al, selected from metals and metalloids, wherein the sum of all parts by mole of Mg, Zn, Al, and the other elements other than Mg, Zn, and Al, selected from metals and metalloids, amounts to 1.00, with the proviso that the amount in parts by mole of the other elements other than Mg, Zn, and Al, selected from metals and metalloids is lower than the amount in parts by mole of Mg and is lower than the amount in parts by mole of Zn, wherein the parts by mole are as measured by Rutherford Backscattering Spectroscopy. In some embodiments, the third element is Al, and the mixture comprises or consists essentially of from 0.40 to 0.49 parts by mole Mg, 0.40 to 0.49 parts by mole Zn, 0.02 to 0.11, preferably 0.02 to 0.10, more preferably 0.02 to 0.06, parts by mole Al, and 0.00 to 0.18 parts by mole of the other elements other than Mg, Zn, and Al, selected from metals and metalloids, wherein the sum of all parts by mole of Mg, Zn, Al, and the other elements other than Mg, Zn, and Al, selected from metals and metalloids amounts to 1.00, wherein the parts by mole are as measured by Rutherford Backscattering Spectroscopy.

In some embodiments, the third element is Ga, and the mixture comprises or consists essentially of from 0.40 to 0.60 parts by mole Mg, 0.20 to 0.40 parts by mole Zn, 0.10 to 0.30 parts by mole Ga, and 0.00 to 0.15 parts by mole of the other elements other than Mg, Zn, and Ga, selected from metals and metalloids, wherein the sum of all parts by mole of Mg, Zn, Ga, and the other elements other than Mg, Zn, and Ga, selected from metals and metalloids, amounts to 1.00, wherein the parts by mole are as measured by Rutherford Backscattering Spectroscopy. In some embodiments, the third element is Ga, and the mixture comprises or consists essentially of from 0.45 to 0.55 parts by mole Mg, 0.25 to 0.35 parts by mole Zn, 0.15 to 0.25 parts by mole Ga, and 0.00 to 0.15 parts by mole of the other elements other than Mg, Zn, and Ga, selected from metals and metalloids, wherein the sum of all parts by mole of Mg, Zn, Ga, and the other elements other than Mg, Zn, and Ga, selected from metals and metalloids amounts to 1.00, wherein the parts by mole are as measured by Rutherford Backscattering Spectroscopy.

In some embodiments, the oxygen is present in an amount that is within 10 mole-%, preferably within 2 mole-%, such as within 1 mole-% of, most preferably equal to, a stoichiometric amount. In some embodiments, the amount of oxygen, in moles, in the mixed metal oxide is within 10 mole-%, preferably within 2 mole-%, such as within 1 mole-% of, most preferably equal to, the sum, in moles, of the stoichiometric amount of oxygen with respect to each metal, and possibly each metalloid, in the mixture. In other words, the combination of the mixture a) and the oxygen b) of the mixed metal oxide comprises or consists essentially of ZnO, MgO, and an oxide of the third element selected from Al and Ga, e.g., a metal oxide selected from Al$_2$O$_3$ (aluminium oxide) and Ga$_2$O$_3$ (gallium oxide), respectively, and possibly one or more other stoichiometric metal oxides and/or one or more stoichiometric metalloid oxides, except for a possible margin of up to 10 mole-%, preferably up to 2 mole-%, such as 1 mole-%, in the amount of oxygen. In some embodiments, oxygen is present in an amount in parts per mole that is within 10 mole-%, preferably within 2 mole-%, such as within 1 mole-% of, preferably equal to, the sum, in moles, of the amount of Zn, the amount of Mg, and 1.5 times the amount of the third element selected from Al and Ga. In this last embodiment, the mixed metal oxide may additionally contain oxygen due to oxides of the other elements other than Mg, Zn, and the selected third element, selected from metals and metalloids. It is an advantage of embodiments of the present disclosure that the presence of oxygen may facilitate the deposition of the mixed metal oxide at a low temperature.

In some embodiments, the elements of the mixture comprise or consist essentially of Zn, Mg, the third element selected from Al and Ga, and, if present, the other elements other than Mg, Zn, and the selected third element, selected from metals and metalloids, are randomly mixed, e.g., are randomly distributed through the mixed metal oxide. Preferably, the mixture is homogeneous. In some embodiments, the oxides of Zn, Mg, and the third element selected from Al and Ga, and, if present, the other elements other than Zn, Mg, and the selected third element, selected from metals and metalloids, and possibly the impurities, are randomly mixed in the mixed metal oxide. That is, preferably, the oxides of Zn, Mg, and the third element selected from Al and Ga, are randomly mixed. The mixed metal oxide preferably forms a homogeneous material. It is an advantage of these embodiments that each component of the mixed metal oxide contributes homogeneously, throughout the mixed metal oxide, to the electrical properties of the material. Thereby, the properties of the mixed metal oxide may be homogeneous.

In some embodiments wherein the third element is Al, preferably, the amount of the other elements other than Mg, Zn, and Al, selected from metals and metalloids in the mixture a) is from 0.00 to 0.14 parts by mole, such as from 0.00 to 0.10 parts by mole, preferably from 0.00 to 0.05 by mole, with the proviso that it is lower than the amount of Al in the mixture a). In some embodiments wherein the third element is Ga, preferably, the amount of the other elements other than Mg, Zn, and Ga, selected from metals and metalloids in the mixture a) is from 0.00 to 0.10 parts by mole, preferably from 0.00 to 0.05 by mole. It is an advantage of embodiments of the present disclosure that the other elements other than Mg, Zn, and the selected third element, selected from metals and metalloids are present in low amounts, so that the electrical properties of the mixed metal oxide are similar to the good electrical properties and good stability of the mixed metal oxide in absence of the other elements other than Mg, Zn, and the selected third element, selected from metals and metalloids.

In some embodiments, the mixed metal oxide is in an amorphous phase. It is an advantage of these embodiments that no crystallization of the mixed metal oxide may be performed. Crystallization may occur upon annealing at very high temperatures, e.g., above 400° C. In some embodiments wherein the third element is Al, preferably, the amount of Mg in the mixture in parts by mole is within 0.05 from the amount of Zn in parts by mole. It is an advantage of embodiments of the present disclosure that a bandgap of the mixed metal oxide may be similar to a bandgap of a-InGaZnO$_4$, that is at present widely used in the field of thin-film transistors. In some embodiments, the bandgap of the mixed metal oxide may be maximum 1 eV higher than the bandgap of a-InGaZnO$_4$. In some embodiments, the bandgap of the mixed metal oxide may be maximum 0.5 eV lower than the bandgap of a-InGaZnO$_4$. This is advantageous as it allows the mixed metal oxide to remain transparent in the visible region of the electromagnetic spectrum. Preferably, the mixed metal oxide is transparent in the visible region of the electromagnetic spectrum.

In embodiments wherein the third element is Al, the other elements other than Mg, Zn, and Al, selected from metals and metalloids may comprise any metal or metalloid, different from Mg, Zn, and Al. In embodiments wherein the third element is Al, the other elements other than Mg, Zn, and Al, selected from metals and metalloids may comprise Ga. In different embodiments wherein the third element is Al, the other elements other than Mg, Zn, and Al, selected from metals and metalloids may not comprise Ga. In some embodiments wherein the third element is Al, an amount of Ga in the mixture may be from 0.00 to 0.15, preferably from 0.00 to 0.10, more preferably from 0.00 to 0.05 parts by mole. In some embodiments, the amount in parts by mole of Ga is smaller than the amount in parts by mole of Al.

In embodiments wherein the third element is Ga, the other elements other than Mg, Zn, and Ga, selected from metals and metalloids may comprise any metal or metalloid, different from Mg, Zn, and Ga. In embodiments wherein the third element is Ga, the other elements other than Mg, Zn, and Ga, selected from metals and metalloids may comprise Al. In different embodiments wherein the third element is Ga, the other elements other than Mg, Zn, and Ga, selected from metals and metalloids may not comprise Al. In embodiments wherein the third element is Ga, an amount of Al in the mixture may be from 0.00 to 0.15, preferably from 0.00 to 0.10, more preferably from 0.00 to 0.05 parts by mole, with the proviso that the amount in parts by mole of Al is smaller than the amount in parts by mole of Ga. In some embodiments, the mixed metal oxide contains less than 0.001 parts by mole of non-metallic and non-metalloid impurities. In preferred embodiments, the mixed metal oxide contains less than 0.0005 parts by mole of each non-metallic and non-metalloid impurity, e.g., hydrogen. It is an advantage of a high purity for the mixed metal oxide, that good electrical properties may be obtained.

Any features of any embodiment of the first aspect may be independently as correspondingly described for any embodiment of any of the other aspects of the present disclosure.

In a second aspect, the present disclosure relates to a method for forming the oxide according to embodiments of the first aspect, comprising depositing a magnesium oxide, a zinc oxide, and an oxide of a third element selected from Al and Ga, and optionally one or more other oxides other than magnesium oxide, zinc oxide, and the oxide of the third element selected from Al and Ga, selected from metal oxides and metalloid oxides on a substrate, so as to form a mixed metal oxide comprising or consisting essentially of: a) a mixture comprising or consisting essentially of 0.30 to 0.69 parts by mole Mg, 0.20 to 0.69 parts by mole Zn, 0.01 to 0.30 parts by mole of the third element selected from Al and Ga, and either, when the third element is Al, 0.00 to 0.31 parts by mole of other elements other than Mg, Zn, and Al, selected from metals and metalloids, or when the third element is Ga, 0.00 to 0.15 parts by mole of other elements other than Mg, Zn, and Ga, selected from metals and metalloids, wherein the sum of all parts by mole of Mg, Zn, the third element selected from Al and Ga, and the other elements other than Mg, Zn, and the selected third element, selected from metals and metalloids amounts to 1.00, with the proviso that the amount in parts by mole of the other elements other than Mg, Zn, and the selected third element, selected from metals and metalloids is lower than the amount in parts by mole of Mg and is lower than the amount in parts by mole of Zn, b) oxygen, and c) less than 0.01 parts by mole of non-metallic and non-metalloid impurities, wherein the parts by mole are as measured by Rutherford Backscattering Spectroscopy.

In embodiments wherein the third element is Al, preferably, the method for forming the oxide comprises depositing a magnesium oxide, a zinc oxide, an aluminum oxide, and optionally one or more other oxides other than magnesium oxide, zinc oxide, and aluminium oxide, selected from metal oxides and metalloid oxides on a substrate, so as to form a mixed metal oxide comprising or consisting essentially of: a) a mixture comprising or consisting essentially of 0.30 to 0.69 parts by mole Mg, 0.30 to 0.69 parts by mole Zn, 0.01 to 0.15 parts by mole Al, and 0.00 to 0.31 parts by mole of other elements other than Mg, Zn, and Al, selected from metals and metalloids, wherein the sum of all parts by mole of Mg, Zn, Al, and the other elements other than Mg, Zn, and Al, selected from metals and metalloids amounts to 1.00, with the proviso that the amount in parts by mole of the other elements other than Mg, Zn, and Al, selected from metals and metalloids is lower than the amount in parts by mole of Mg and is lower than the amount in parts by mole of Zn, b) oxygen, preferably in a stoichiometric amount, and c) less than 0.01 parts by mole of non-metallic and non-metalloid impurities, wherein the parts by mole are as measured by Rutherford Backscattering Spectroscopy.

In embodiments wherein the third element is Ga, preferably, the method for forming the oxide comprises depositing a magnesium oxide, a zinc oxide, a gallium oxide, and optionally one or more other oxides other than magnesium oxide, zinc oxide, and gallium oxide, selected from metal oxides and metalloid oxides on a substrate, so as to form a mixed metal oxide comprising or consisting essentially of: a) a mixture comprising or consisting essentially of from 0.40 to 0.60 parts by mole Mg, 0.20 to 0.40 parts by mole Zn, 0.10 to 0.30 parts by mole Ga, and 0.00 to 0.15 parts by mole of the other elements other than Mg, Zn, and Ga, selected from metals and metalloids, wherein the sum of all parts by mole of Mg, Zn, Ga, and the other elements other than Mg, Zn, and Ga, selected from metals and metalloids amounts to 1.00, with the proviso that the amount in parts by mole of the other elements other than Mg, Zn, and Ga, selected from metals and metalloids is lower than the amount in parts by mole of Mg and is lower than the amount in parts by mole of Zn, b) oxygen, preferably in a stoichiometric amount, and c) less than 0.01 parts by mole of non-metallic and non-metalloid impurities, wherein the parts by mole are as measured by Rutherford Backscattering Spectroscopy.

In some embodiments, the deposition is performed at a temperature of at most 400° C., preferably in a temperature range of from 200° C. to 400° C. It is an advantage of embodiments of the present disclosure that the mixed metal oxide may be deposited in the BEOL stage of a manufacturing process of a semiconductor structure, and with forming stacks of transistors, e.g., in 3D memory devices, without damaging other components of the semiconductor structure. In some embodiments, the substrate comprises a semiconductor device.

In some embodiments, the magnesium oxide, the zinc oxide, the oxide of a third element selected from Al and Ga, and the optional one or more other oxides other than magnesium oxide, zinc oxide, and the oxide of the third element selected from Al and Ga, selected from metal oxides and metalloid oxides are deposited using physical vapour deposition. It is an advantage of these embodiments that physical vapour deposition may result in a homogenous, uniform mixture of the oxides. It is an advantage of these embodiments that physical vapour deposition is compatible with the BEOL stage of semiconductor manufacturing, and with forming 3D memory devices. In some embodiments, the substrate comprises silicon. In some embodiments, the substrate comprises a monocrystalline silicon wafer.

In some embodiments, the physical vapour deposition is performed by sputtering using a magnesium oxide target, a zinc oxide target, when the oxide of the third element selected from Al and Ga is the aluminium oxide, an aluminium target, and, when the oxide of the third element selected from Al and Ga, a gallium target. In some embodiments, a first AC potential field is applied to the magnesium oxide target and to the zinc oxide target at a frequency of from 100 kHz to 10 MHz, and a DC potential field is applied to the aluminium target, when present, or the gallium target, when present. In preferred embodiments, the DC potential field applied to the aluminium target, when present, or the gallium target, when present, is a pulsed DC potential field. It is an advantage of these embodiments that the deposition of the metal oxides may be efficient. When other elements other than Mg, Zn, and the selected third element, selected from metal and metalloids are present in the mixture, the deposition of the oxides of these other elements other than Mg, Zn, and the selected third element, selected from metal and metalloids, may be performed by sputtering using a corresponding metal or metalloid target or using a corresponding metal oxide or metalloid oxide target.

In some embodiments, the magnesium oxide, the zinc oxide, the oxide of a third element selected from Al and Ga, and the optional one or more other oxides other than magnesium oxide, zinc oxide, and the oxide of the third element selected from Al and Ga, selected from metal oxides and metalloid oxides are deposited using chemical vapour deposition such as atomic layer deposition.

Any features of any embodiment of the second aspect may be independently as correspondingly described for any embodiment of any of the other aspects of the present disclosure.

In a third aspect, the present disclosure relates to a transistor comprising the oxide according to embodiments of the first aspect.

In some embodiments, the oxide according to embodiments of the first aspect forms a channel layer. It is an advantage of these embodiments that a charge mobility in the on-stage of the transistor may be high. It is an advantage of these embodiments that a charge mobility in the off-stage of the transistor may be low.

In some embodiments, the transistor is a thin film transistor. In some embodiments, the thin film transistor comprises the mixed metal oxide over, e.g., on, a substrate, e.g., a glass substrate, a silicon substrate, or a polymer substrate. In some embodiments, the thin film transistor comprises a gate material, e.g., indium tin oxide, over, e.g., on, the substrate. The substrate may comprise a semiconductor device. Preferably, the mixed metal oxide is located over the gate material, or the gate material is located over the mixed metal oxide. The gate material is typically separated from the mixed metal oxide by an insulator material, such as $SiO_2$, $Al_2O_3$, silicon nitride, or $HfO_2$. The mixed metal oxide typically contacts a drain and a source electrode, which preferably comprise a metal. The process for making thin-film transistors, e.g., channels of thin-film transistors, is typically carried out at particularly low temperatures of formation. It is an advantage of embodiments of the present disclosure that the combination of good charge mobility, low formation temperature, and chemical stability, may make the oxide according to embodiments of the present disclosure particularly well-suited for applications in thin-film transistors.

Any features of any embodiment of the third aspect may be independently as correspondingly described for any embodiment of any of the other aspects of the present disclosure.

The disclosure will now be described by a detailed description of several embodiments of the disclosure. It is clear that other embodiments of the disclosure can be configured according to the knowledge of persons skilled in the art without departing from the technical teaching of the disclosure, the disclosure being limited only by the terms of the appended claims.

Example 1: Theoretical Calculations

First principles theoretical calculations, within the framework of density functional theory using the PBEsol functional, were performed to assess the electrical properties and the stability of a range of mixed metal oxides. Herein, the electrical properties are defined by the magnitude of the bandgap, and the inverse state weighted overlap (ISWO) parameter. The ISWO parameter may define the overlap of orbitals between atoms in a material. A low ISWO value represents a delocalized molecular orbital, whose atomic orbitals are continuously connected between the different atomic sites. A high ISWO value represents a highly localized and poorly connected molecular orbital. The ISWO parameter, and how it may be calculated, is further described in A. de Jamblinne de Meux et al., "Method to Quantify the Delocalization of Electronic States in Amorphous Semiconductors and its Application to Assessing Charge Carrier Mobility of P-type Amorphous Oxide Semiconductors," Physical Review B 97 (2018) 045208.

In this example, calculations were performed for primary, one metal and oxygen, and binary, two metals and oxygen, amorphous oxides, for 12 metals and metalloids (Mg, Al, Si, Ti, Zn, Ga, Zr, Ag, Cd, In, Sn, and Sb). Machine learning (support vector machines) was used to develop predictor functions for oxides containing up to all 12 elements and oxygen. A single objective function F(x) (shown below) was developed, that, when minimized, predicts the most promising material. By varying the weights and target gap in the objective function, it was found that mixed metal oxides comprising or consisting essentially of Mg, Zn, and Al as metal, have promising properties. Hereinbelow, results are shown for an amorphous mixed metal oxide comprising or consisting essentially of Zn, Mg, Al, and oxygen in a stoichiometric amount, as a function of the amount of Zn, Mg, and Al in the mixed metal oxide. Reference is made to FIG. 1, which is a triangular plot of the ISWO of the conduction band of the mixed metal oxide, as dependent on the amount of Zn, Mg, and Al in the mixed metal oxide. Preferably, the ISWO of the conduction band is as low as possible. A low ISWO for the conduction band may correspond to a continuous molecular orbital for the conduction band, and a potentially high charge mobility in the conduction band. For a transistor channel comprising or consisting essentially of a material having a low ISWO for the conduction band, there may be a high current through the channel in an on-state of the transistor. A low ISWO for the conduction band is found for mixed metal oxides wherein Mg, Zn, and Al are present in a close to equal amount.

Figure 2:
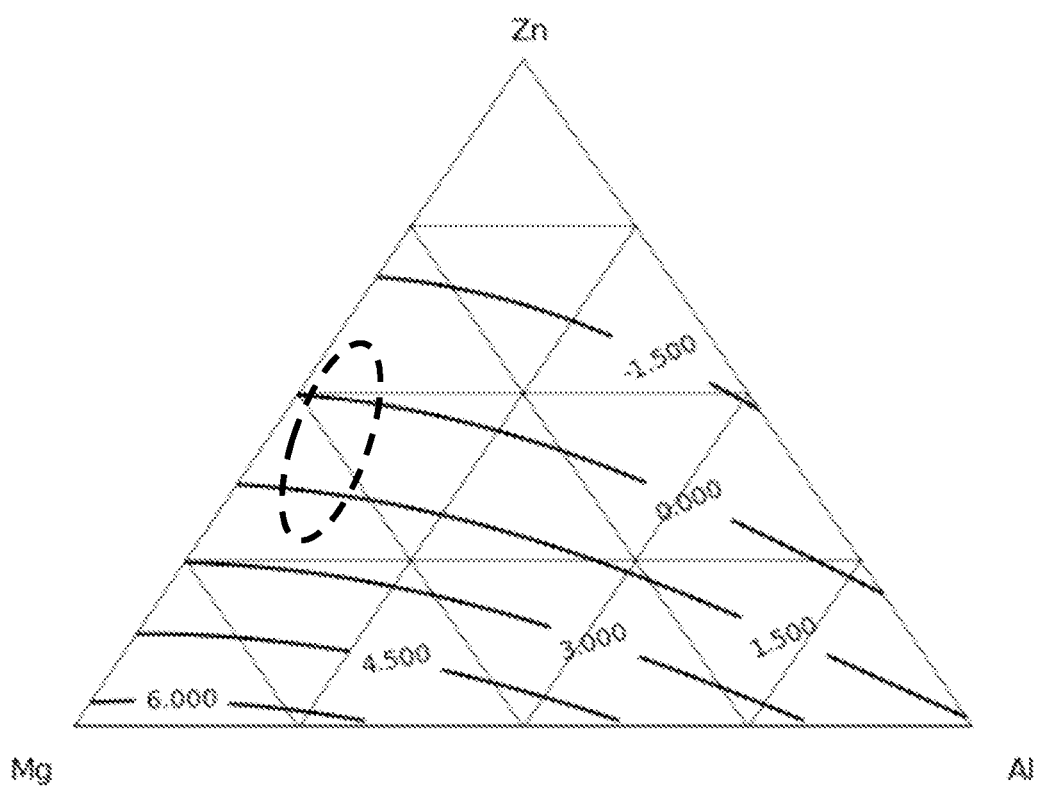
FIG. 2 is a triangular plot of the inverse state weighted overlap of the valence band of a mixed metal oxide, as dependent on the amount of Zn, Mg, and Al in the mixed metal oxide.

Reference is made to FIG. 2, which is a triangular plot of the ISWO of the valence band of the mixed metal oxide as dependent on the amount of Zn, Mg, and Al in the mixed metal oxide. Preferably, the ISWO of the valence band is as high as possible. A high ISWO for the valence band may correspond to a discontinuous molecular orbital for the valence band, and a potentially low charge mobility in the valence band. For a transistor channel comprising or consisting essentially of a material having a high ISWO for the valence band, there may be a low current through the channel in an off-state of the transistor. A high ISWO for the valence band is found for mixed metal oxides comprising or consisting essentially of Mg.

Figure 3:
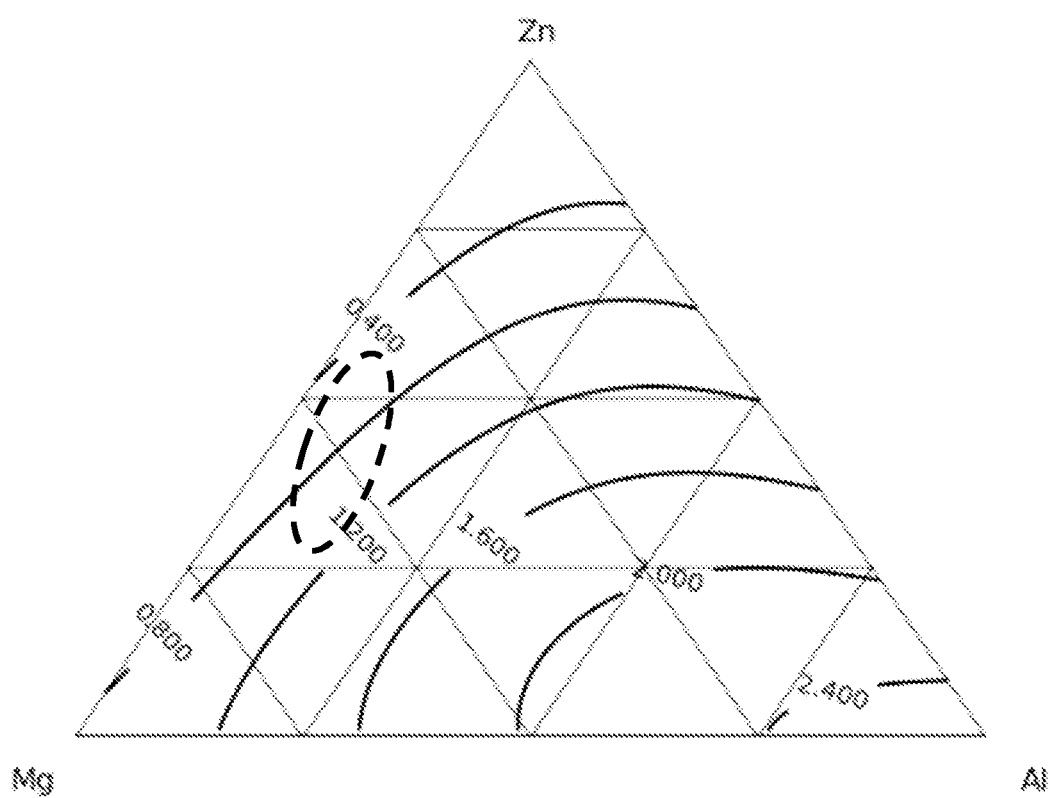
FIG. 3 is a triangular plot of the bandgap of a mixed metal oxide, as dependent on the amount of Zn, Mg, and Al in the mixed metal oxide.

Reference is made to FIG. 3, which is a triangular plot of the bandgap of the mixed metal oxide, as dependent on the amount of Zn, Mg, and Al in the mixed metal oxide. Preferably, the bandgap of the mixed metal oxide is similar to, or a bit, e.g., 1 eV, higher than the bandgap of a-InGaZnO$_4$. It may be observed that the bandgap increases with increasing amount of Al. For a transistor comprising a channel comprising the mixed metal oxide, the large bandgap means that the charge mobility may be low in the off state, and high in the on-state of the transistor. However, doping may be increasingly difficult for larger band gaps.

Figure 4:
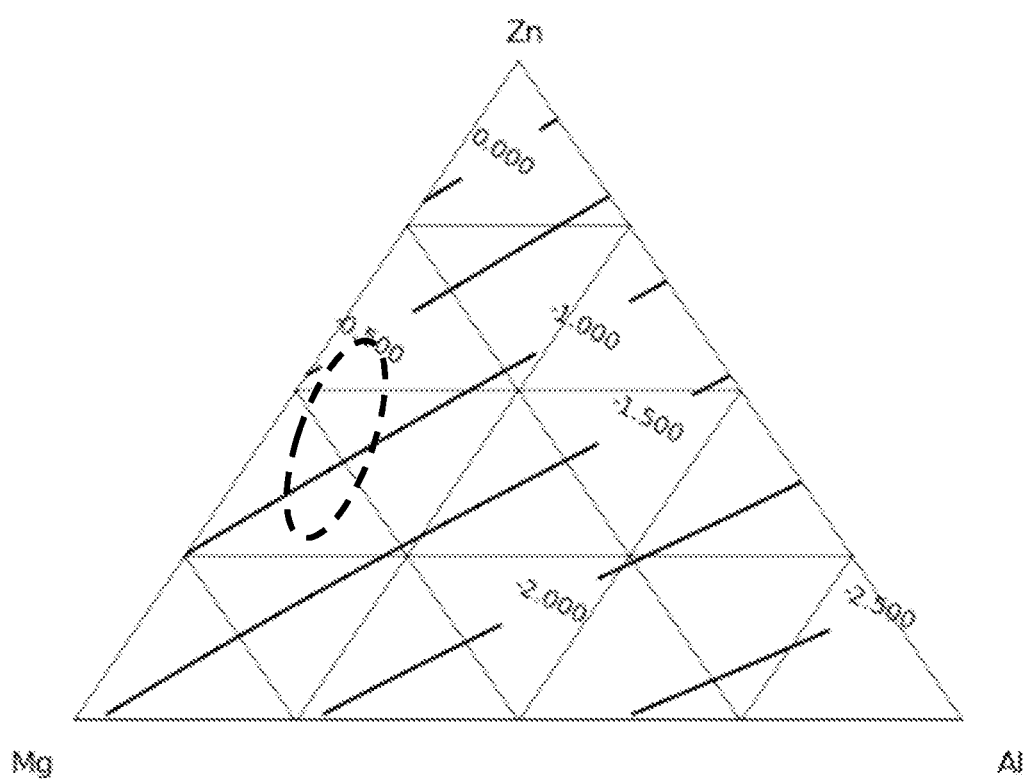
FIG. 4 is a triangular plot of the energy of formation of the mixed metal oxide, as dependent on the amount of Zn, Mg, and Al in the mixed metal oxide.

Reference is made to FIG. 4, which is a triangular plot of the energy of formation of the mixed metal oxide, as dependent on the amount of Zn, Mg, and Al in the mixed metal oxide. It may be observed that the energy of formation reduces, and, correspondingly, the stability increases, with increasing amount of Al.

Reference is made to Table A. To find an optimum with respect to material properties, four parameters are defined. Herein, a bandgap is defined with respect to the bandgap of a-InGaZnO$_4$, e.g., $\Delta$-gap=G(x). Furthermore, an ISWO of the conduction band of the mixed metal oxide is defined with respect to an ISWO of the conduction band of a-InGaZnO$_4$, e.g., $\Delta$-ISWO$_C$=I$_c$(x). In addition, an ISWO of the valence band of the mixed metal oxide is defined with respect to the ISWO of the valence band of a-InGaZnO$_4$, e.g., $\Delta$-ISWO$_V$=I$_v$(x). Finally, a relative energy of formation of the mixed metal oxide is provided that is the difference between: the energy of formation with respect to the energy of formation of isolated atoms of the mixed metal oxide in the gas phase; and the energy of formation with respect to the energy of formation of isolated atoms of a-InGaZnO$_4$ in the gas phase. The relative energy of formation is given as $\Delta$-E$_{form}$=E$_f$(x). Herein, a negative value means that the mixed metal oxide is calculated to be more stable than a-InGaZnO$_4$. Herein, x is for the amounts of Al, Mg, and Zn in the mixed metal oxide.

TABLE A

Calculated electronic properties, and formation energies, for a range of compositions

| Metal content | $\Delta$-gap = G(x) | $\Delta$-ISWO$_C$ = I$_c$(x) | $\Delta$-ISWO$_V$ = I$_v$(x) | $\Delta$-E$_{form}$ = E$_f$(x) |
|---|---|---|---|---|
| Mg$_{0.49}$Zn$_{0.51}$ | 0.42 | −0.92 | −0.10 | −0.53 |
| Al$_{0.02}$Mg$_{0.43}$Zn$_{0.55}$ | 0.45 | −1.03 | −0.55 | −0.50 |
| Al$_{0.01}$Mg$_{0.47}$Zn$_{0.51}$ | 0.47 | −1.00 | −0.16 | −0.55 |
| Al$_{0.03}$Mg$_{0.55}$Zn$_{0.41}$ | 0.65 | −1.07 | 0.87 | −0.79 |
| Al$_{0.07}$Mg$_{0.45}$Zn$_{0.49}$ | 0.69 | −1.25 | 0.04 | −0.73 |
| Al$_{0.06}$Mg$_{0.50}$Zn$_{0.44}$ | 0.71 | −1.20 | 0.51 | −0.79 |
| Al$_{0.08}$Mg$_{0.59}$Zn$_{0.33}$ | 0.90 | −1.23 | 1.81 | −1.05 |
| Al$_{0.11}$Mg$_{0.48}$Zn$_{0.41}$ | 0.93 | −1.42 | 0.75 | −0.97 |
| Al$_{0.10}$Mg$_{0.54}$Zn$_{0.36}$ | 0.95 | −1.37 | 1.36 | −1.04 |

To derive an optimum with respect to each of the parameters, an objective function is calculated according to the following formula:

$$F(x)=(G(x)-G_t)^2+AI_c(x)-BI_v(x)+CE_f(x)$$

wherein G(x)=$\Delta$-gap, I$_C$(x)=$\Delta$-ISWO$_C$, I$_V$(x)=$\Delta$-ISWO$_V$, and E$_f$(x)=$\Delta$-E$_{form}$, each as a function of composition, e.g., amount of Mg, Zn, and Al. Herein, $G_t$ is a target bandgap, and A, B, and C are weight factors. The optimum with respect to material properties corresponds to a minimum in F(x). Herein, for each of $G_t$ and weight factors A, B, and C, the following values were used: $G_t$: [0, 0.25, 0.5, 0.75, 1]; A: [0.1, 0.2]; B: [0.01, 0.02]; and C: [0.0, 0.5, 1.0, 1.5]. For all these 4×2×2×4 combinations, F(x) is optimized. All unique solutions are collected in Table A.

A minimum in F(x) is calculated to be in the dashed elliptical region indicated in FIG. 1, FIG. 2, FIG. 3, and FIG. 4, and corresponds to a balance between good electrical properties and good stability. According to the present calculations, these properties compare well with, and may be better than, the corresponding properties of InGaZnO$_4$, e.g., IGZO, that is at present generally used in the field of thin-film transistors. Preferred embodiments of the present disclosure correspond to mixed metal oxides having an amount of Mg, Zn, and Al, close to that of the optimum.

Figure 5:
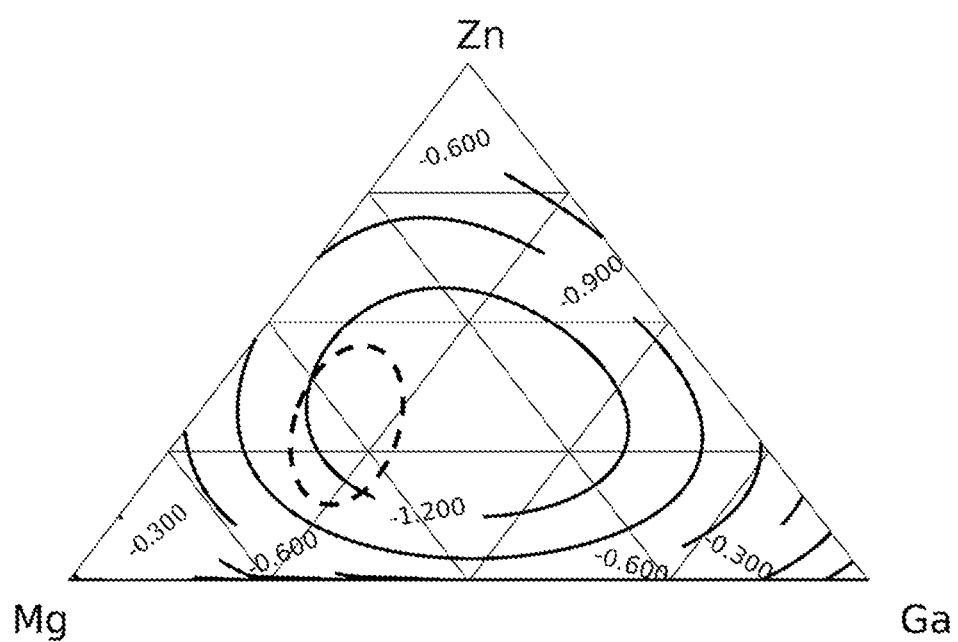
FIG. 5 is a triangular plot of the inverse state weighted overlap of the conduction band of a mixed metal oxide, as dependent on the amount of Zn, Mg, and Ga in the mixed metal oxide.

In addition, from varying the weights and target gap in the objective function, it was also found that mixed metal oxides comprising or consisting essentially of Mg, Zn, and Ga as metal, have promising properties. Similar calculations as above have also been performed for mixed metal oxides comprising or consisting essentially of Mg, Zn, and Ga as metal, which are now discussed. Reference is made to FIG. 5, which is a triangular plot of the ISWO of the conduction band of the mixed metal oxide, as dependent on the amount of Zn, Mg, and Ga in the mixed metal oxide. Preferably, the ISWO of the conduction band is as low as possible. A low ISWO for the conduction band is found for mixed metal oxides wherein Mg, Zn, and Ga are present in a close to equal amount.

Figure 6:
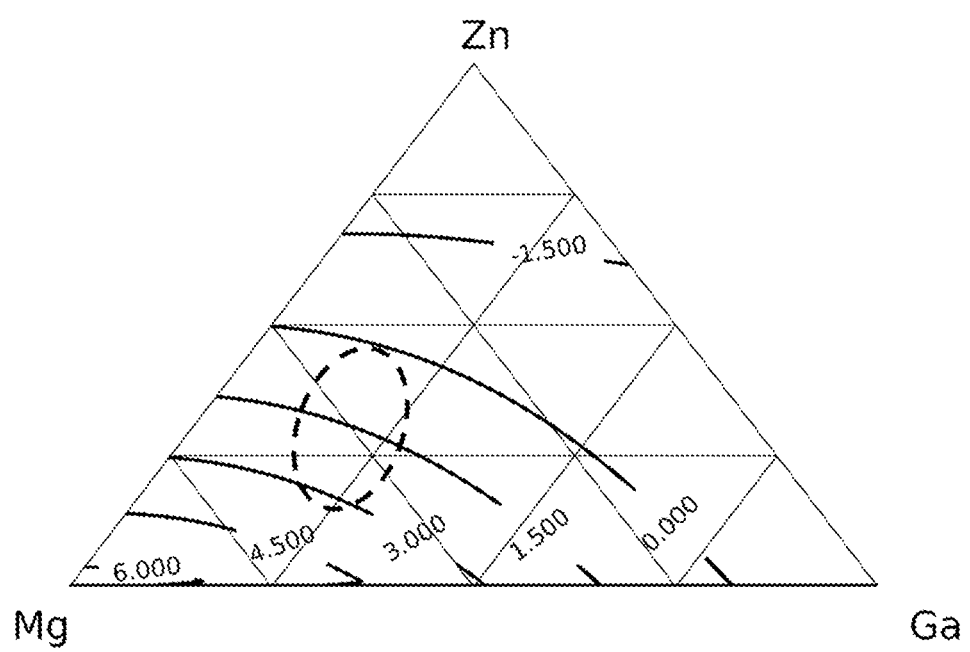
FIG. 6 is a triangular plot of the inverse state weighted overlap of the valence band of a mixed metal oxide, as dependent on the amount of Zn, Mg, and Ga in the mixed metal oxide.

Reference is made to FIG. 6, which is a triangular plot of the ISWO of the valence band of the mixed metal oxide as dependent on the amount of Zn, Mg, and Ga in the mixed metal oxide. Preferably, the ISWO of the valence band is as high as possible. A high ISWO for the valence band is found for mixed metal oxides comprising or consisting essentially of Mg.

Figure 7:
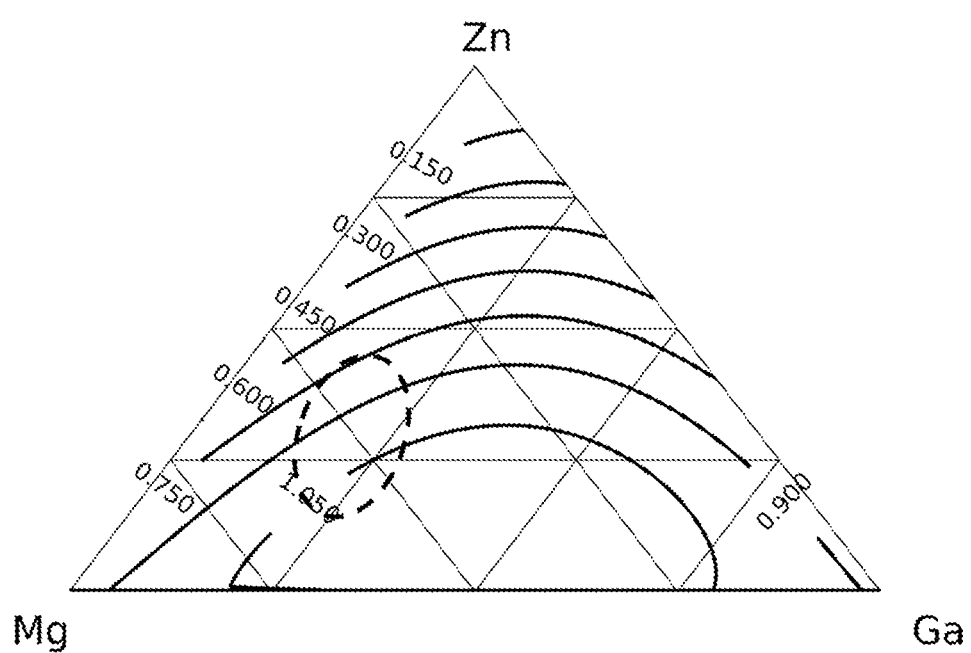
FIG. 7 is a triangular plot of the bandgap of a mixed metal oxide, as dependent on the amount of Zn, Mg, and Ga in the mixed metal oxide.

Reference is made to FIG. 7, which is a triangular plot of the bandgap of the mixed metal oxide, as dependent on the amount of Zn, Mg, and Ga in the mixed metal oxide. Preferably, the bandgap of the mixed metal oxide is similar to, or a bit, e.g., 1 eV, higher than the bandgap of a-InGaZnO$_4$. It may be observed that the bandgap increases with increasing amount of Ga and Mg.

Figure 8:
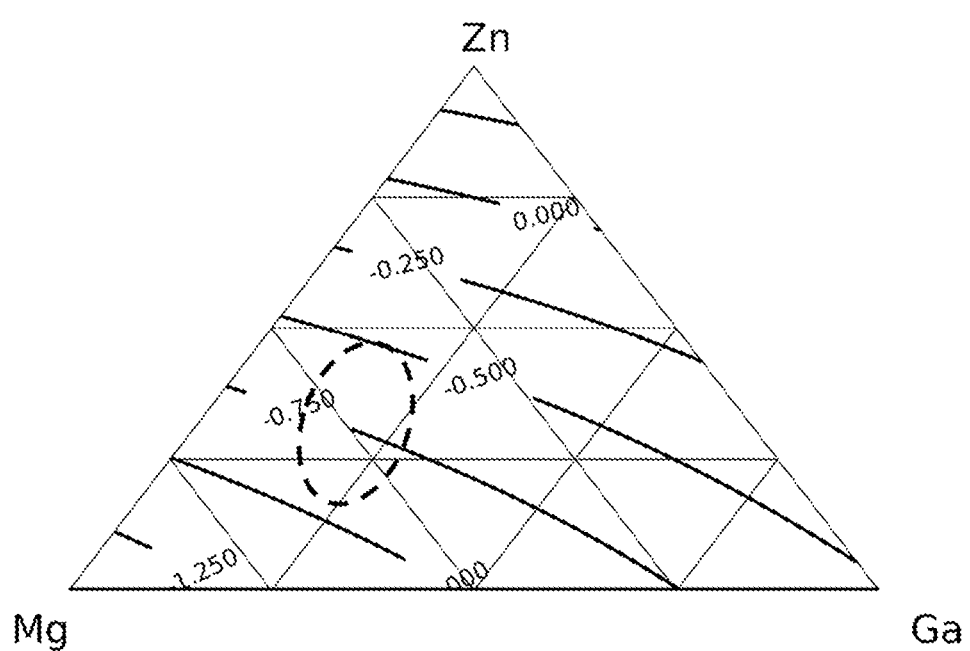
FIG. 8 is a triangular plot of the energy of formation of the mixed metal oxide, as dependent on the amount of Zn, Mg, and Ga in the mixed metal oxide.

Reference is made to FIG. 8, which is a triangular plot of the energy of formation of the mixed metal oxide, as dependent on the amount of Zn, Mg, and Ga in the mixed metal oxide. It may be observed that the energy of formation reduces, and, correspondingly, the stability increases, with increasing amount of Mg and Ga.

Reference is made to Table B, which shows results for similar calculations for the same parameters as performed above for mixed metal oxides comprising or consisting essentially of Mg, Zn, and Al (summarized in Table A), but these calculations are now performed for mixed metal oxides comprising or consisting essentially of Mg, Zn, and Ga as metal, that is, wherein x is now for the amounts of Ga, Mg, and Zn in the mixed metal oxide. A minimum in F(x) is, again, calculated (with x now for the amounts of Ga, Mg, and Zn) and is indicated by the dashed elliptical region indicated in FIG. 5, FIG. 6, FIG. 7, and FIG. 8, and corresponds to a balance between good electrical properties and good stability. According to the present calculations, these properties compare well with, and may be better than, the corresponding properties of InGaZnO$_4$, e.g., IGZO, that is at present generally used in the field of thin-film transistors. Preferred embodiments of the present disclosure correspond to mixed metal oxides having an amount of Mg, Zn, and Ga, close to that of the optimum.

TABLE B

Calculated electronic properties, and formation energies, for a range of compositions

| Metal content | Δ-gap = G(x) | Δ-ISWO$_C$ = I$_c$(x) | Δ-ISWO$_V$ = I$_v$(x) | Δ-E$_{form}$ = E$_f$(x) |
|---|---|---|---|---|
| Ga$_{0.09}$Mg$_{0.41}$Zn$_{0.50}$ | 0.61 | −1.17 | −0.2 | −0.48 |
| Ga$_{0.02}$Mg$_{0.61}$Zn$_{0.36}$ | 0.62 | −0.88 | 1.44 | −0.78 |
| Ga$_{0.12}$Mg$_{0.37}$Zn$_{0.51}$ | 0.65 | −1.23 | −0.36 | −0.44 |
| Ga$_{0.11}$Mg$_{0.41}$Zn$_{0.48}$ | 0.66 | −1.22 | −0.07 | −0.5 |
| Ga$_{0.09}$Mg$_{0.45}$Zn$_{0.45}$ | 0.67 | −1.19 | 0.26 | −0.56 |
| Ga$_{0.06}$Mg$_{0.54}$Zn$_{0.39}$ | 0.68 | −1.06 | 1.03 | −0.7 |
| Ga$_{0.08}$Mg$_{0.50}$Zn$_{0.42}$ | 0.68 | −1.13 | 0.69 | −0.64 |
| Ga$_{0.04}$Mg$_{0.64}$Zn$_{0.32}$ | 0.69 | −0.85 | 1.93 | −0.84 |
| Ga$_{0.05}$Mg$_{0.60}$Zn$_{0.35}$ | 0.69 | −0.94 | 1.6 | −0.79 |
| Ga$_{0.02}$Mg$_{0.70}$Zn$_{0.27}$ | 0.7 | −0.67 | 2.6 | −0.94 |
| Ga$_{0.19}$Mg$_{0.41}$Zn$_{0.41}$ | 0.85 | −1.37 | 0.4 | −0.58 |
| Ga$_{0.14}$Mg$_{0.52}$Zn$_{0.34}$ | 0.86 | −1.24 | 1.39 | −0.74 |
| Ga$_{0.12}$Mg$_{0.58}$Zn$_{0.30}$ | 0.87 | −1.11 | 1.99 | −0.83 |
| Ga$_{0.22}$Mg$_{0.36}$Zn$_{0.41}$ | 0.88 | −1.42 | 0.2 | −0.55 |
| Ga$_{0.09}$Mg$_{0.73}$Zn$_{0.19}$ | 0.88 | −0.66 | 3.63 | −1.05 |
| Ga$_{0.21}$Mg$_{0.41}$Zn$_{0.39}$ | 0.89 | −0.14 | 0.52 | −0.6 |
| Ga$_{0.20}$Mg$_{0.43}$Zn$_{0.37}$ | 0.9 | −1.38 | 0.77 | −0.64 |
| Ga$_{0.17}$Mg$_{0.52}$Zn$_{0.32}$ | 0.91 | −1.28 | 1.51 | −0.75 |
| Ga$_{0.18}$Mg$_{0.49}$Zn$_{0.34}$ | 0.91 | −1.32 | 1.24 | −0.71 |
| Ga$_{0.15}$Mg$_{0.58}$Zn$_{0.27}$ | 0.92 | −1.15 | 2.13 | −0.84 |
| Ga$_{0.14}$Mg$_{0.60}$Zn$_{0.26}$ | 0.92 | −1.09 | 2.39 | −0.88 |
| Ga$_{0.13}$Mg$_{0.67}$Zn$_{0.21}$ | 0.93 | −0.89 | 3.16 | −0.98 |

Example 2: Method for Forming the Mixed Metal Oxide

Figure 9:
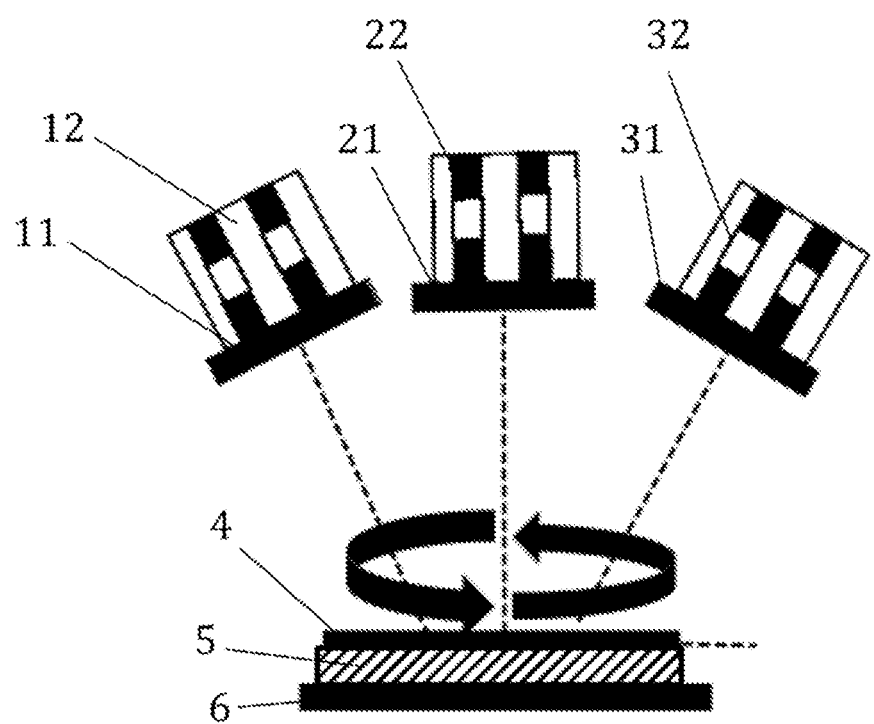
FIG. 9 is a schematic representation of a combinatorial physical vapour deposition system.

Reference is made to FIG. 9, which is a schematic representation of a combinatorial physical vapour deposition system that may be used for performing a method according to embodiments of the second aspect of the present disclosure, to form a mixed metal oxide according to embodiments of the first aspect of the present disclosure. The combinatorial physical vapour deposition system of this example may deposit oxides, e.g., MgO, one of Al$_2$O$_3$ and Ga$_2$O$_3$, and ZnO. For the deposition, in the example, three sputter targets 11, 21, and 31 are mounted, each on an individual cathode 12, 22, and 32. Each of the sputter targets 11, 21, and 31 is aimed towards a substrate 5. In this example, the substrate 5 is a 300 mm diameter Si wafer. Heating of the substrate 5 may be enabled by clamping the substrate 5 to an electrically heated rotating chuck 6. The deposition is typically performed in an Ar atmosphere, although also other gases may be used. Ar may be ionized and accelerated towards each of the targets 11, 21, and 31, by application of a potential to each of the corresponding cathodes 12, 22, and 32. The impact of the Ar ions on a target 11, 21, or 31 induces a release of atoms or atom clusters from the target 11, 21, or 31. This process is referred to as 'sputtering'.

Depending on the conductance of the target 11, 21, or 31, the potential applied to the cathode 12, 22, or 32 may be oscillated. When the target 11, 21, or 31 comprises an oxide material, e.g., MgO, Al$_2$O$_3$, Ga$_2$O$_3$, or ZnO, the applied potential may oscillate at a frequency inside the radio frequency domain. When the target 11, 21, or 31 is an elemental target, e.g., Mg, Ga, or Al, a DC potential may be applied. In this example, a MgO target 11 and a ZnO target 21 are powered with an oscillating potential, and an elemental Al target 31 is powered with a pulsed DC potential.

Instead of the elemental Al target 31, an elemental Ga target could be used, which may also be powered with a pulsed DC potential. To obtain a fully oxidized material with elemental targets, $O_2$ may be added to the sputtering gas. The $O_2$ gas may oxidize the target during the sputtering process, thereby forming an insulating top layer on the target. In that case, a pulsed DC potential is preferably used. Pressure is regulated by the total flow, e.g., Ar flow and $O_2$ flow, and is typically in the range of a few, e.g., 1 to 10, Pa.

A uniform deposition, e.g., a uniform mixed metal oxide 4, may be achieved by optimization of the aiming angle of the cathodes 12, 22, and 32, and by rotation of the substrate 5 at a high rate. Typically, a deposition rate is low enough to facilitate random mixing of the elements during deposition. Thereby, the deposition may result in a uniform film of the mixed metal oxide 4. The composition of the film 4, e.g., the amounts of Zn, Mg, and Al in the mixed metal oxide 4, may be regulated by adjusting the potential that is applied to each cathode 12, 22, and 32. In this example, the film 4 contains oxides of Zn, Mg, and Al. When, instead of the elemental Al target 31, the elemental Ga target is used, the composition of the film 4 contains oxides of Zn, Mg, and Ga.

It is to be understood that although preferred embodiments, specific constructions, and configurations, as well as materials, have been discussed herein for devices according to the present invention, various changes or modifications in form and detail may be made without departing from the scope of this invention. Steps may be added or deleted to methods described within the scope of the present invention.

What is claimed is:

1. A mixed metal oxide comprising:
    a mixture comprising:
        0.30 to 0.69 parts by mole Mg,
        0.20 to 0.69 parts by mole Zn,
        0.01 to 0.30 parts by mole of a third element selected from Al and Ga, and
        at least one other element selected from metals and metalloids other than Mg, Zn and the third element, wherein when the third element is Al, the at least one other element is present at greater than zero and up to 0.31 parts by mole, and wherein when the third element is Ga, the at least one other element is present at greater than zero and up to 0.15 parts by mole;
    oxygen; and
    less than 0.01 parts by mole of non-metallic and non-metalloid impurities,
    wherein a sum of all parts by mole of Mg, Zn, the third element, and the at least one other element amounts to 1.00, and
    wherein the amount in parts by mole of the at least one other element is lower than the amount in parts by mole of each of Mg and Zn.

2. The mixed metal oxide according to claim 1, wherein the third element is Al and the at least one other element is Ga.

3. The mixed metal oxide according to claim 1, wherein the third element is Ga and the at least one other element is Al.

4. The mixed metal oxide according to claim 1, wherein the third element is Al and the mixture comprises:
    0.30 to 0.69 parts by mole Mg;
    0.30 to 0.69 parts by mole Zn;
    0.01 to 0.15 parts by mole Al; and
    0.00 to 0.31 parts by mole of the at least one other element selected from metals and metalloids other than Mg, Zn and Al.

5. The mixed metal oxide according to claim 4, wherein the amount of Mg in parts by mole is within 0.05 of the amount of Zn in parts by mole.

6. The mixed metal oxide according to claim 1, wherein the third element is Ga and the mixture comprises:
    0.40 to 0.60 parts by mole Mg;
    0.20 to 0.40 parts by mole Zn;
    0.10 to 0.30 parts by mole Ga; and
    0.00 to 0.15 parts by mole of the at least one other element selected from metals and metalloids other than Mg, Zn and Ga.

7. The mixed metal oxide according to claim 1, wherein the third element is Ga and the mixture comprises:
    0.45 to 0.55 parts by mole Mg;
    0.25 to 0.35 parts by mole Zn;
    0.15 to 0.25 parts by mole Ga; and
    0.00 to 0.15 parts by mole of the at least one other element selected from metals and metalloids other than Mg, Zn and Ga.

8. The mixed metal oxide according to claim 1, wherein the oxygen is present in an amount that is within 10 mole-% of a stoichiometric amount.

9. The mixed metal oxide according to claim 1, wherein the mixed metal oxide is in an amorphous phase.

10. A method for forming a mixed metal oxide, the method comprising:
    depositing a magnesium oxide, a zinc oxide, and an oxide of a third element selected from Al and Ga on a substrate to form the mixed metal oxide,
    wherein the mixed metal oxide comprises:
        a mixture comprising:
            0.30 to 0.69 parts by mole Mg,
            0.20 to 0.69 parts by mole Zn,
            0.01 to 0.30 parts by mole of the third element selected from Al and Ga, and
            at least one other element selected from metals and metalloids other than Mg, Zn and the third element, wherein when the third element is Al, the at least one other element is present at greater than zero and up to 0.31 parts by mole, and wherein when the third element is Ga, the at least one other element is present at greater than zero and up to 0.15 parts by mole;
        oxygen; and
        less than 0.01 parts by mole of non-metallic and non-metalloid impurities,
        wherein a sum of all parts by mole of Mg, Zn, the third element, and the at least one other element amounts to 1.00, and
        wherein the amount in parts by mole of the at least one other element is lower than the amount in parts by mole of each of Mg and Zn.

11. The method according to claim 10, further comprising depositing one or more other oxides of the at least one other element on the substrate.

12. The method according to claim 10, wherein the depositing is performed at a temperature lower than about 400° C.

13. The method according to claim 10, wherein the depositing is at a temperature range of about 200 to about 400° C.

14. The method according to claim 10, wherein the magnesium oxide, the zinc oxide, and the oxide of the third element selected from Al and Ga are deposited using physical vapor deposition.

15. The method according to claim 14, wherein the physical vapor deposition is performed by sputtering using a magnesium oxide target, a zinc oxide target, and a target of the third element.

16. The method according to claim 15, wherein a first AC potential field is applied to the magnesium oxide target and to the zinc oxide target at a frequency of from 100 kHz to 10 MHz, and a DC potential field is applied to the target of the third element.

17. The method according to claim 10, wherein the substrate comprises silicon.

18. A transistor comprising a mixed metal oxide, the mixed metal oxide comprising:
   a mixture comprising:
      0.30 to 0.69 parts by mole Mg,
      0.20 to 0.69 parts by mole Zn,
      0.01 to 0.30 parts by mole of a third element selected from Al and Ga, and
      at least one other element selected from metals and metalloids other than Mg, Zn and the third element, wherein when the third element is Al, the at least one other element is present at greater than zero and up to 0.31 parts by mole, and wherein when the third element is Ga, the at least one other element is present at greater than zero and up to 0.15 parts by mole;
   oxygen; and
   less than 0.01 parts by mole of non-metallic and non-metalloid impurities,
   wherein a sum of all parts by mole of Mg, Zn, the third element, and the at least one other element amounts to 1.00, and
   wherein the amount in parts by mole of the at least one other element is lower than the amount in parts by mole of each of Mg and Zn.

19. The transistor according to claim 18, wherein the mixed metal oxide forms a channel layer.

20. The transistor according to claim 18, wherein the transistor is a thin film transistor.

* * * * *